United States Patent [19]
Kang

[11] Patent Number: 5,748,557
[45] Date of Patent: May 5, 1998

[54] ADDRESS BUFFER FOR HIGH-SPEED ADDRESS INPUTTING

[75] Inventor: Bok-Moon Kang, Kyungki-do, Rep. of Korea

[73] Assignee: Samsung Electronics Co., Ltd., Suwon, Rep. of Korea

[21] Appl. No.: 770,250

[22] Filed: Dec. 20, 1996

[30] Foreign Application Priority Data

Dec. 27, 1995 [KR] Rep. of Korea ................. 59448/1995

[51] Int. Cl.$^6$ ........................................... G11C 8/00
[52] U.S. Cl. ..................... 365/230.08; 365/230.06; 365/189.05
[58] Field of Search ................. 365/230.08, 230.06, 365/189.05

[56] References Cited

U.S. PATENT DOCUMENTS

| | | | |
|---|---|---|---|
| 4,825,420 | 4/1989 | Min | 365/230.08 |
| 5,124,584 | 6/1992 | McClure | 365/230.08 |
| 5,596,537 | 1/1997 | Sukegawa et al. | 365/230.06 |

*Primary Examiner*—Vu A. Le
*Attorney, Agent, or Firm*—Jones & Volentine, L.L.P.

[57] ABSTRACT

An address buffer for a semiconductor memory device having an address input buffer and an address predecoder incorporated together so as to be driven in a single channel, capable of reducing an address predecoding time by a logic combination of outputs of address input buffer, for high speed of operation of a memory device. The address buffer is provided with one or more address input means connected between a power supply voltage and a ground voltage, for amplifying a given number of addresses received from an external device to thereby provide a stable level of outputs in response to an address input enable signal, a delay circuit having inputs connected with the outputs of said address input means, for converting the outputs of said address input means into a stable logic level and delaying the outputs by a given time interval for a delivery in conformity with the addressing time, an address predecoder connected with the outputs of said delay circuit, for providing a decoded address according to a predetermined logic combination of the outputs of said delay circuit, a transmission latch circuit coupled to said address predecoder, for transmitting and latching the decoded address from said address predecoder in accordance with an address latch signal, and an output driver coupled to said transmission latch circuit, for driving the decoded address output from said transmission latch circuit in a stable level for a delivery to a memory cell.

12 Claims, 4 Drawing Sheets

ADDRESS BUFFER FOR HIGH-SPEED ADDRESS INPUTTING

BACKGROUND OF THE INVENTION

1. Field of the Invention

The present invention relates to an address buffer for use in a semiconductor memory device, and more particularly to the address buffer having an address input buffer and an address predecoder incorporated together so as to be driven in a single channel.

2. Description of the Related Art

In recent years, as a semiconductor memory device or memory array is highly advanced in its capacity and integration and in its diversity of functions, there has been increasingly the necessity for a higher speed of memory device in the state of the art as a rule. In general, as the semiconductor memory device is recently being manufactured with a very high or ultra high capacity of chip, its chip size inevitably tends to become larger and larger, thereby possibly resulting in the delay of its operation speed. Accordingly, with the larger size of memory chip, the higher speed of semiconductor memory device is preferred in various electronic devices. In order to meet this requirement, a new technology of the semiconductor memory device having quite high operation speed such as RAMBUS, Synchronous Dynamic Random Access Memory (Sync DRAM), etc. has been developed. In these kinds of memory devices to meet the above requirement an address decoding technic is mostly used, wherein an output of address input buffer is generated by receiving an address input and a predecoding technic is then used by a combination of two or more of the address input buffer outputs. Accordingly, this unavoidable procedure of such address decoding and predecoding in the semiconductor memory device will often lead to a drawback of the decrease of operation speed.

Referring to FIGS. 1a and 1b, there are shown detailed circuit diagrams for the construction of an address input buffer, represented by symbol (a), and a predecoder, represented by symbol (b), according to a prior art, in which the address input buffer includes an invertor 21 receiving an address input buffer enable signal PBUFE and an address input means 80, of differential amplifier type, receiving an address Ai and a reference voltage Vref and having P-channel metal oxide semiconductor (PMOS) transistors 5, 9 and 11, and N-channel metal oxide semiconductor (NMOS) transistors 3, 7 and 13. Further, the address input buffer comprises a delay circuit 100 having a plurality of inverters 23 to 50 to set an address setup time, a transmission latch circuit 120 coupled to an output of the delay circuit 100, having an invertor 25, a transmission gate 30 and inverters 27 and 29, for selectively transmitting and latching the output of the delay circuit responsive to an address latch signal PYALB, and an address output driver 200 coupled to an output of the transmission latch circuit having inverters 31 and 33. Furthermore, in a like manner, a second address input buffer, disposed below the aforementioned address buffer, includes an invertor 81 receiving an address input buffer enable signal. PBUFE and an address input means 90 of differential amplifier type receiving an address Aj and having P-channel metal oxide semiconductor (PMOS) transistors 65, 69 and 71, and N-channel metal oxide semiconductor (NMOS) transistors 63, 67 and 73. Also, the second address input buffer comprises a delay circuit 300 having a plurality of inverters 60 to 103 to set an address setup time, a transmission latch circuit 320 coupled to an output of the delay circuit 300, having an invertor 35, a transmission gate 40 and inverters 107 and 109, for selectively transmitting and latching the output of the delay circuit responsive to an address latch signal PYALB, and an address output driver 400 coupled to an output of the transmission latch circuit having inverters 111 and 113. The predecoder (b) comprises a predecoder 500 having NAND gates 131, 141, 151 and 161 each having two inputs connected with the respective outputs of the address input buffer and inverters 133, 143, 153 and 163 connected with the NAND gates, for predecoding by a logical combination of the output addresses CAi, CAiB, CAj and CAjB, wherein explanation is made to the column address for example, of the address input buffer, and a predecoder driver 600 having inverters 135 to 167 to drive the predecoded signals.

According to the operation of the above circuit, each address input means 80 and 90 of the address input buffer determines the respective current driving capability of PMOS transistors 5 and 65 by the reference voltage Vref when the address input buffer enable signal PBUFE is enabled, and a voltage level of node N1 is dependent upon the current driving capability of NMOS transistors 3 and 63, thereby controlling the respective current drive of NMOS transistors 7 and 67. Here, once the respective current driving capability of PMOS transistors 9 and 69 is determined according to the status of address Ai and Aj, a voltage level of a second node N2 is determined by the current driving capability of NMOS transistors 7 and 67 as well as PMOS transistors 9 and 69. Therefore, either logic 'high' or logic 'low' signal is delivered to a node N3 by a trip point determined in the inverters 50 and 60 of the delay circuits 100 and 300. The voltage level delivered to the third node N3 is further provided to the inputs of the output drivers 200 and 400 if the address latch signal PYALB is enabled. Then, according to a combination of the address outputs, the output of a single predecoder only is enabled in the address predecoder 500 to determine a cell position of a memory device. During this operation, as the address predecoding operation has to be made upon passing through the respective address output drivers 200 and 400 and the address predecoder 500 in the enabled point of the address latch signal PYALB, following receipt of the address Ai and Aj, it is needed more time to determine the cell position in the memory device.

SUMMARY OF THE INVENTION

The present invention is devised to solve the aforementioned problem and it is therefore an object of the present invention to provide an address input buffer incorporating an address input buffer and an address predecoder together capable of reducing an address predecoding time by a logic combination of outputs of address input buffer, for high speed of operation of a memory device.

The above noted object may be effected by providing an address buffer for inputting an address for assigning a memory cell in a semiconductor memory device, comprising:

one or more address input means connected between a power supply voltage and a ground voltage, for amplifying a given number of addresses received from an external device to thereby provide a stable level of outputs in response to an address input enable signal;

a delay circuit having inputs connected with the outputs of said address input means, for converting the outputs of said address input means into a stable logic level and delaying the outputs by a given time interval for a delivery in conformity with the addressing time;

an address predecoder connected with the outputs of said delay circuit, for providing a decoded address according to a predetermined logic combination of the outputs of said delay circuit;

a transmission latch circuit coupled to said address predecoder, for transmitting and latching the decoded address from said address predecoder in accordance with an address latch signal; and an output driver coupled to said transmission latch circuit, for driving the decoded address output from said transmission latch circuit in a stable level for a delivery to a memory cell.

BRIEF DESCRIPTION OF THE DRAWINGS

A more complete appreciation of the invention and many of the attendant advantages thereof will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

A preferred embodiment of a guide apparatus of a contact image sensor according to the present invention will be described in detail with reference to the accompanying drawings.

Figure 1A:
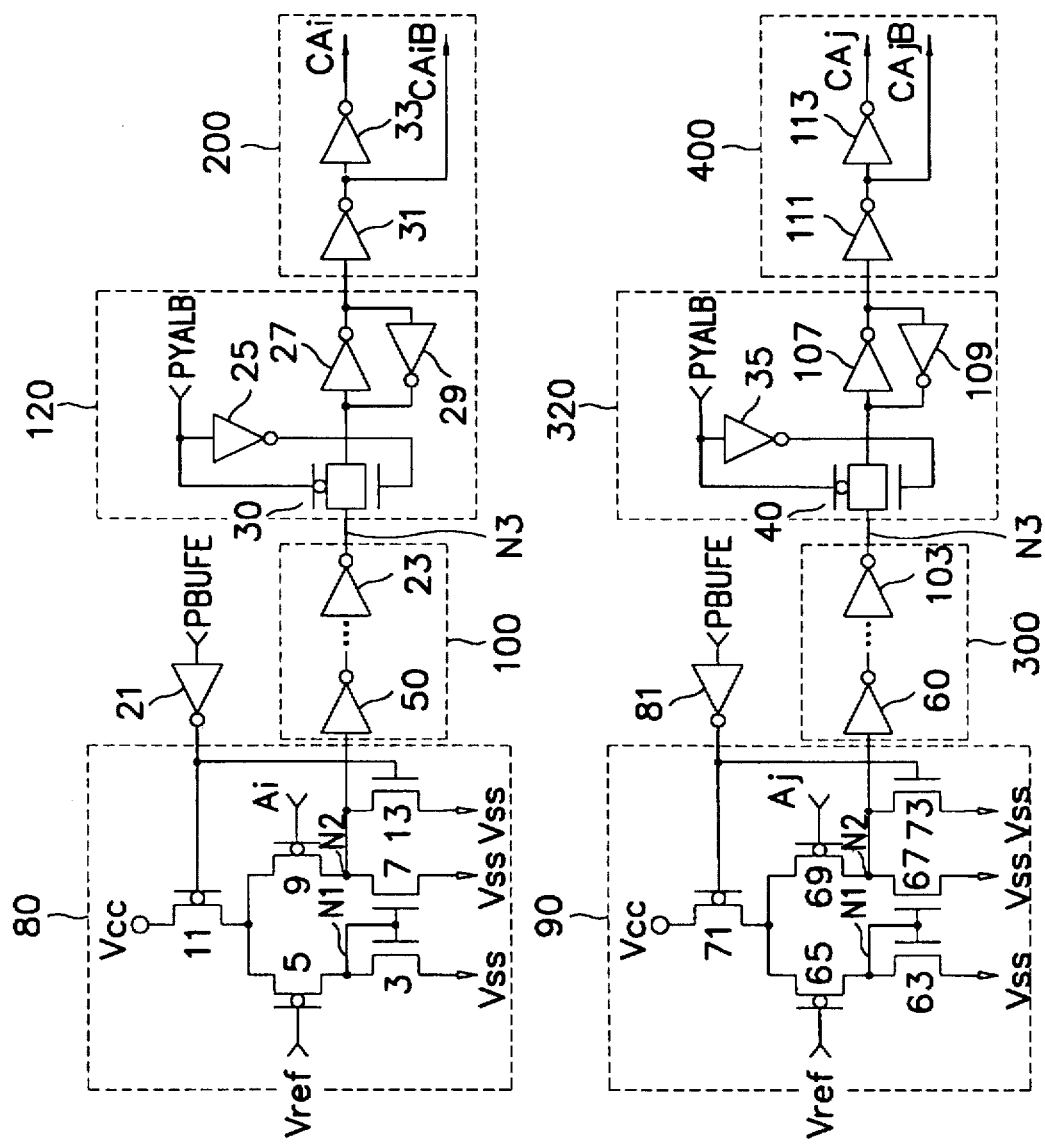
FIGS. 1a and 1b are detailed circuit diagrams showing the construction of an address input buffer and an address predecoder according to a prior art.
Figure 1B:
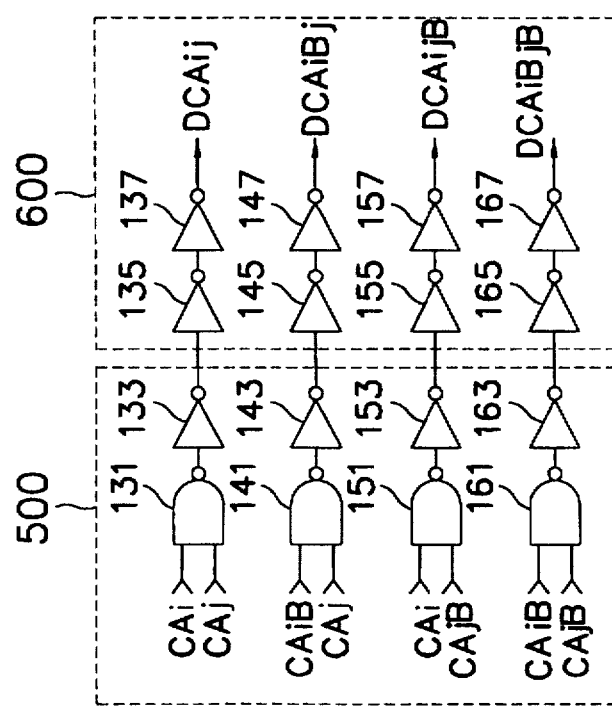
Figure 2:
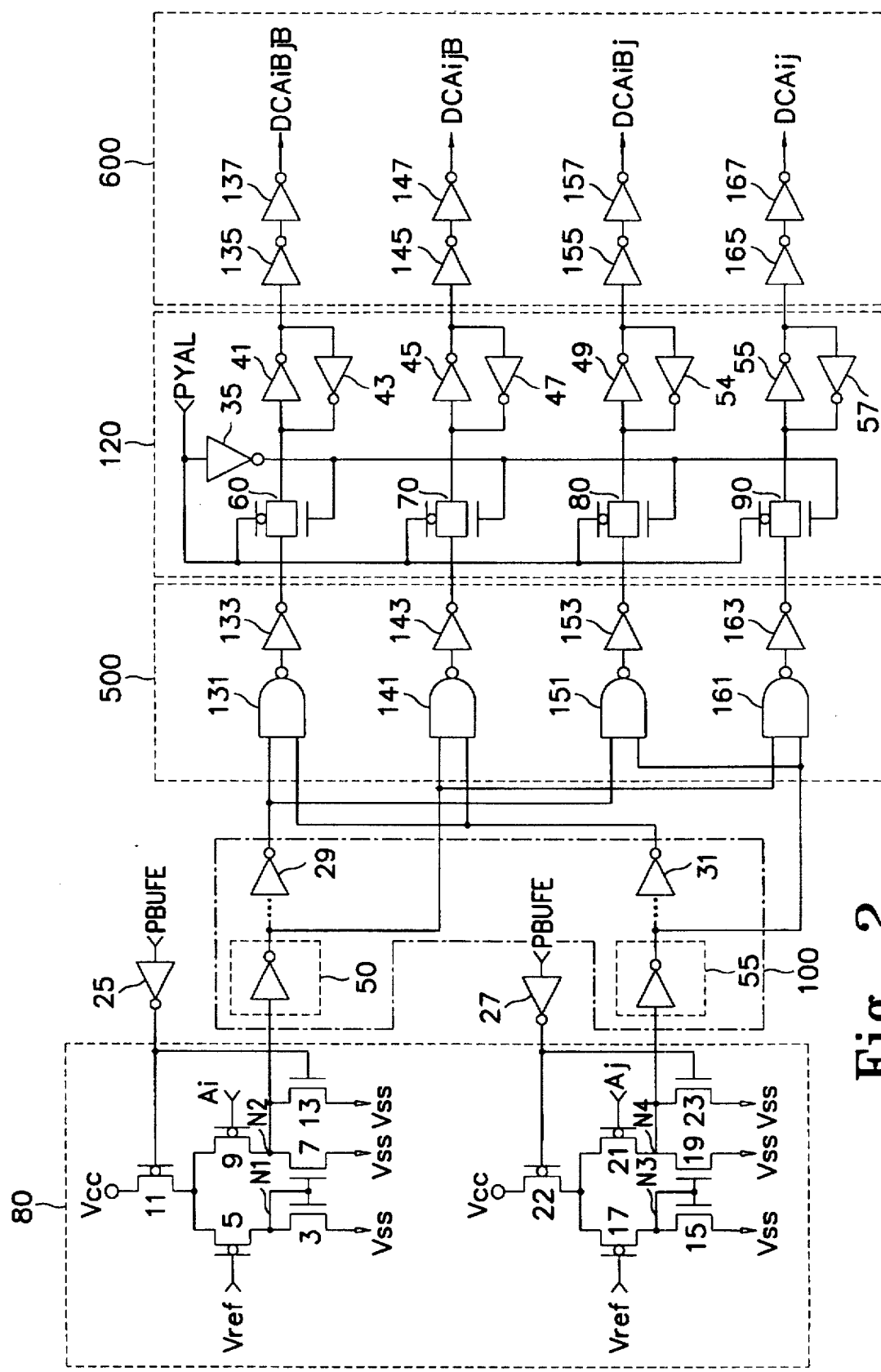
FIG. 2 is a detailed circuit diagram showing the construction of an address input buffer incorporating an address predecoder according to the present invention.

Turning now to the drawings, FIG. 2 shows the circuit construction of the address input buffer incorporating the address predecoder according to the present invention, which comprises investors 25 and 27 receiving an address input buffer enable signal PBUFE and an address input means 80 having two differential amplifiers therein, each receiving addresses Ai and Aj and a reference voltage Vref, and each having P-channel metal oxide semiconductor (PMOS) transistors (5, 9 and 11) or (17 21 and 22) and N-channel metal oxide semiconductor (NMOS) transistors (3, 7 and 13) or (15, 19 and 23). Further, the address input buffer comprises a delay circuit 100 including a plurality of inverters 29 to 31 and a pair of CMOS level converters 50 and 55 each having an input coupled to the output of the address input means 80 in order to set an address setup time; an address predecoder 500 having NAND gates 131, 141, 151 and 161 of which two respective inputs are in a logical combination connected with either one output of the inverters 29 and 31 and the CMOS level converters 50 and 55 of the delay circuit 100 and having inverters 133, 143, 153 and 163 each connected with the NAND gates; a transmission latch circuit 120, of which respective inputs are coupled to the respective outputs of the address predecoder 500, having an invertor 35, four parallel transmission gates 60, 70, 80 and 90, and four pairs of inverters (41, 43), (45, 47), (49, 54) and (55, 57) corresponding to the transmission gates, for selectively transmitting and latching the each output of the predecoder responsive to an address latch signal PYALB;

and a predecoder driver 600, coupled to the transmission latch circuit 120, having inverters (135, 137), (145, 147), (155, 157) and (165, 167) to drive the predecoded signals.

Describing now the operation of the inventive circuit, once the address input means 80 is enabled by the address input buffer enable signal PBUFE, the current driving capability of the PMOS transistors 5 and 17 is controlled by the reference voltage Vref, which in turn controls operation of the NMOS transistors 3 and 15. Further, each voltage level at nodes N1 and N3 is applied to control the NMOS transistors 7 and 19 to turn on/off, which in turn determine the voltage level of nodes N2 and N4. As a trip point of the inverters 50 and 55 of the delay circuit 100 is determined by an external power voltage Vcc, the voltage levels in the nodes N2 and N4 are converted to CMOS levels "logic high" or "logic low" through the inverters 50 and 55 acting as a CMOS level converter. The inverters 25 and 27 receiving the external signal PBUFE are respectively connected with gates of the PMOS transistors 11 and 22 to control turn on/off of these transistors. Thus, outputs of the address input means 80 receiving the address Ai and Aj are converted to the CMOS logic level through the delay circuit 100 including the CMOS level converters 50 and 55 and then delivered to the predecoder 500, which decode the outputs according to a predetermined logic combination to enable the only one output of them prior to enabling of the address latch signal PYALB. Here, the delay circuit 100, for setting the address setup time in the prior art, now controls the delay time inclusive of the address predecoder 500 according to the present invention.

Accordingly, when the outputs of the address predecoder 500 are in "setting" status, the enabling of the address latch signal PYALB causes the address predecoder driver 600 to drive the set output from the address input means 80 through. the transmission latch circuit 120 for a delivery to a given path to designate a memory cell directly, which will have an effect on high speed operation of the memory device.

Figure 3A:
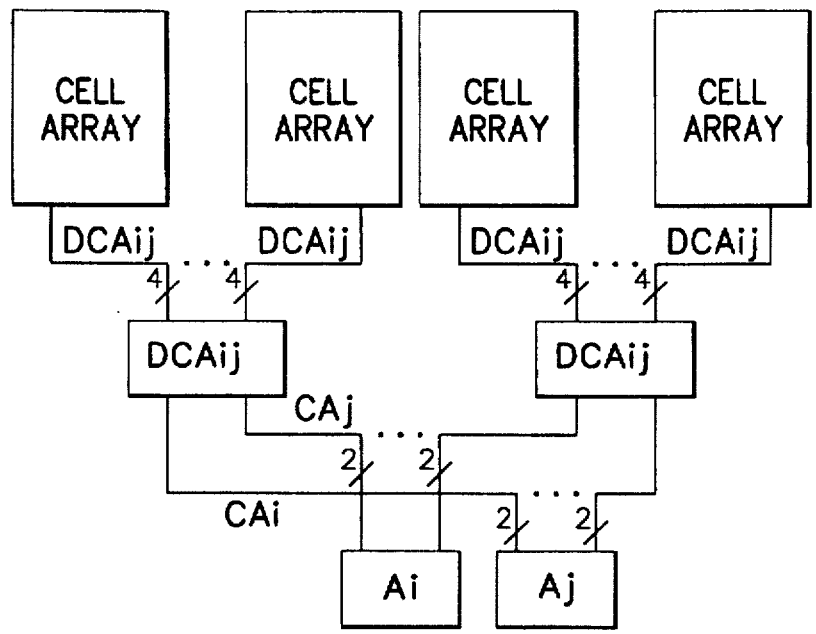
FIGS. 3a and 3b are schematic diagrams showing the respective address driving channels according to the prior art and the present invention in comparison.
Figure 3B:
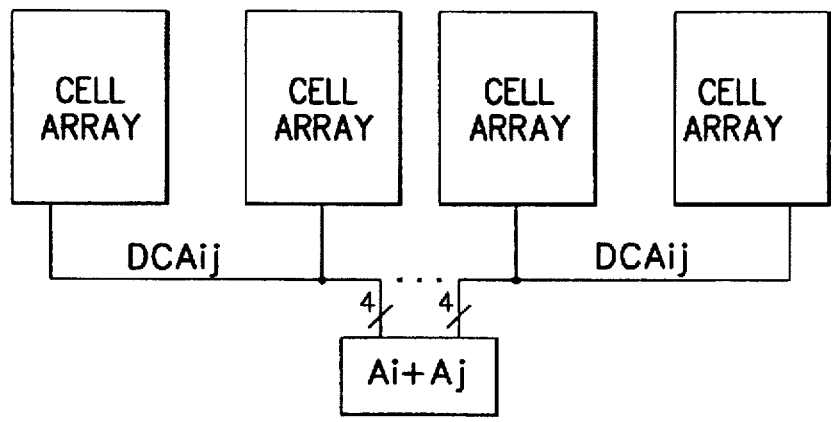

FIGS. 3a and 3b each are schematic diagrams showing the respective address driving paths according to the prior art and the present invention in comparison. Referring now to FIG. 3a, the address input means of the address input buffer receives the addresses Ai and Aj respectively, by which the address output driver outputs the respective addresses CAi, CAiB, CAj and CAjB subsequent to passing through the delay circuit and the transmission latch circuit. Then, the outputs of the address output driver are predecoded in the predecoder to generate the predecoded signals DC Aij, DCAiBj, DCAijB and DCAiBjB which are delivered to a corresponding memory cell through the predecoder driver. Referring further to FIG. 3b, indicating the address transmission path according to the present invention, the addresses Ai and Aj each are inputted to the address input means of the address input buffer and then outputted at the respective delay circuit of the address input buffer. These output signals are directly applied to the address predecoder for a predecoding operation and then the predecoded signals are delivered to the address predecoder driver through the transmission latch signal, thereby enabling the direct delivery of the predecoded address signals into the memory without going by way of the respective address input buffer stage and the address predecoder stage. This direct delivery of address signals will lead to a shorter transmission path than the prior art.

As apparent from the foregoing description,.in order to achieve a high speed of operation from a timing point when the address latch signal PYALB is enabled defining the actual starting point in evaluating the operating speed for a memory, the address buffer according to the present invention receives the address from the address input means of the address input buffer prior to enabling of the signal PYALB and then carries out predecoding of the inputted address beforehand, which construction will result in higher speed of operation in a memory device as compared to the prior art device and, furthermore, decrease a current consumption of the memory chip due to reduced transition of the address lines therein.

The following table illustrates a brief result of a recent simulation carried out in an application of a 256 Mega-bit semiconductor memory device with an address input buffer incorporating together a predecoder in accordance with the teaching of the present invention, by which the advantageous effect of the invention will be appreciated with ease.

TABLE

| Time (PYALB-DCAij) | Time Difference |
|---|---|
| Prior Art 10.15 nsec | N/A |
| Invention 7.4 nsec | −2.75 nsec |
| *Operation Condition in External Power Voltage: | 1.8 Volt |
| Temperature: | 100° C. |
| Reference Voltage (Vref): | 0.9 Volt |
| Address Input: | 0.7–1.1 Volt (Vref + −0.2V) |

As a result, the address buffer according to the present invention receives the address input and, prior to enabling of the address latch signal PYALB, carries out predecoding of the inputted address beforehand, thereafter driving the predecoded address signal just upon enabling of the address latch signal, achieving the higher speed of operation in a memory device by effectively decreasing a time duration for assignment of a cell position within the memory chip.

Although the foregoing embodiment disclosed uses two addresses for better understanding of the gist of the invention, it will be appreciated that various number of addresses more than two may be embodied if desired. Furthermore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. An address buffer for inputting an address for assigning a memory cell in a semiconductor memory device, comprising:

one or more address input means connected between a power supply voltage and a ground voltage, for amplifying a given number of addresses received from an external device to thereby provide a stable level of outputs in response to an address input enable signal;

a delay circuit having inputs connected with the outputs of said address input means, for converting the outputs of said address input means into a stable logic level and delaying the outputs by a given time interval for a delivery in conformity with the addressing time;

an address predecoder connected with the outputs of said delay circuit, for providing a decoded address according to a predetermined logic combination of the outputs of said delay circuit;

a transmission latch circuit coupled to said address predecoder, for transmitting and latching the decoded address from said address predecoder in accordance with an address latch signal; and an output driver coupled to said transmission latch circuit, for driving the decoded address output from said transmission latch circuit in a stable level for a delivery to a memory cell.

2. The address buffer as claimed in claim 1, wherein said address input means is comprised of at least two address input means each having the identical construction to each other.

3. The address buffer as claimed in claim 1, wherein said address input means is comprised of the same number of address input means as a number of addresses provided by an external processor system.

4. The address buffer as claimed in claim 1, wherein said address input means is comprised of at least one differential amplifier.

5. The address buffer as claimed in claim 1, wherein said delay circuit is comprised of a plurality of inverters connectable in a chain type.

6. The address buffer as claimed in claim 5, wherein said delay circuit is comprised of at least one CMOS level converter connectable with an input of said each inverter.

7. The address buffer as claimed in claim 1, wherein said address predecoder is comprised of a plurality of NAND gates and inverters, for decoding the outputs of said address input means according to an inverted logic ANDing operation.

8. The address buffer as claimed in claim 1, wherein said address predecoder carries out a decoding of the outputs of said address input means according to one or more inverted logic ANDing operations.

9. The address buffer as claimed in claim 1, wherein said transmission latch circuit is comprised of the same number of transmission gates and inverter pairs of latch connection as a number of the outputs of said address predecoder.

10. The address buffer as claimed in claim 1, wherein said transmission latch circuit is controlled by either an internally generated control signal or an externally provided control signal as an address latch signal.

11. The address buffer as claimed in claim 1, wherein said address predecoder is connected between said address input means and said transmission latch circuit.

12. The address buffer as claimed in claim 1, wherein said output driver is comprised of an even number of plurality of inverters.

* * * * *